United States Patent
Lutker-Lee et al.

(10) Patent No.: US 12,322,597 B2
(45) Date of Patent: Jun. 3, 2025

(54) PITCH SCALING IN MICROFABRICATION

(71) Applicant: Tokyo Electron Limited, Tokyo (JP)

(72) Inventors: Katie Lutker-Lee, Albany, NY (US); Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 498 days.

(21) Appl. No.: 17/590,442

(22) Filed: Feb. 1, 2022

(65) Prior Publication Data
US 2023/0245890 A1 Aug. 3, 2023

(51) Int. Cl.
*H01L 21/033* (2006.01)
*H01L 21/66* (2006.01)

(52) U.S. Cl.
CPC ...... *H01L 21/0338* (2013.01); *H01L 21/0335* (2013.01); *H01L 21/0337* (2013.01); *H01L 22/20* (2013.01)

(58) Field of Classification Search
None
See application file for complete search history.

(56) References Cited

U.S. PATENT DOCUMENTS

2019/0181014 A1* 6/2019 Chang ................. H01L 21/3086
2021/0217614 A1 7/2021 Lutker-Lee et al.

* cited by examiner

*Primary Examiner* — Feifei Yeung Lopez
(74) *Attorney, Agent, or Firm* — Slater Matsil, LLP

(57) ABSTRACT

A method of processing a substrate that includes: forming a first plurality of lines and a first plurality of recesses, each of the plurality of lines being separated from an adjacent one of the plurality of lines by one of the plurality of recesses, the first plurality of lines including a first material and formed over a to-be-patterned layer; performing a cyclic process including: depositing a mask material over the first plurality of lines and within the first plurality of recesses, the mask material deposited defining a second plurality of lines, each of the second plurality of lines dividing one of the first plurality of recesses to form a second plurality of recesses; and performing a trimming process to increase critical dimensions of the second plurality of recesses; and patterning the to-be-patterned layer using the first plurality of lines and the second plurality of lines as an etch mask.

20 Claims, 10 Drawing Sheets

PITCH SCALING IN MICROFABRICATION

TECHNICAL FIELD

The present invention relates generally to a method of processing a substrate, and, in particular embodiments, to methods for pitch scaling in microfabrication.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

In semiconductor technology scaling, the minimum dimension of features in a patterned layer is shrunk periodically to roughly double the component density at each successive technology node, thereby reducing the cost per function. Advancement in photolithography, such as immersion deep ultraviolet (i-DUV) lithography, and 13.5 nm wavelength extreme ultraviolet (EUV) optical systems have brought some critical dimensions down close to ten nanometers. In addition, multiple patterning may further increase the feature density and enable features below the resolution of a single lithographic exposure. Accordingly, cost effective process flows for patterning may be desired to achieve the nanoscale precision, uniformity, and repeatability that IC manufacturing demands.

SUMMARY

In accordance with an embodiment of the present invention, a method of processing a substrate that includes: forming a first plurality of lines and a first plurality of recesses, each of the plurality of lines being separated from an adjacent one of the plurality of lines by one of the plurality of recesses, the first plurality of lines including a first material and formed over a to-be-patterned layer; performing a cyclic process including a plurality of cycles, each of the plurality of cycles including: depositing a mask material over the first plurality of lines and within the first plurality of recesses, the mask material deposited within the first plurality of recesses defining a second plurality of lines, each of the second plurality of lines dividing one of the first plurality of recesses to form a second plurality of recesses; and performing a trimming process to increase critical dimensions of the second plurality of recesses; and patterning the to-be-patterned layer using the first plurality of lines and the second plurality of lines as an etch mask.

In accordance with an embodiment of the present invention, a method of processing a substrate that includes: patterning, using a lithographic process, a photoresist layer formed over a first layer to form a recess in the patterned photoresist layer, a first portion of the first layer exposed at a bottom surface of the recess and a second portion of the first layer being covered by the patterned photoresist layer; forming a pattern including a mask material over the patterned photoresist layer, the forming including: depositing a top mask and a bottom mask, the top mask being deposited to be in contact with the patterned photoresist layer, the bottom mask being deposited to be in contact with the first layer within the first portion, the top and the bottom masks including the mask material; and forming recesses between the patterned photoresist layer and the bottom mask by a trimming process; and transferring the pattern of the mask material to a second layer disposed below the first layer by etching using the top mask and the bottom mask as an etch mask.

In accordance with an embodiment of the present invention, a method including: forming, with a lithographic process, a patterned photoresist layer including a first plurality of lines at a first pitch and a first plurality of recesses separating the first plurality of lines from each other; forming, without an additional lithographic process, a etch mask including a first mask disposed on the first plurality of lines and a second mask disposed on the first plurality of recesses; and etching through a to-be-patterned layer using the etch mask to form a second plurality of lines at a second pitch and a second plurality of recesses separating the second plurality of lines from each other, the second pitch being smaller than the first pitch.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1F illustrate an example substrate during an example process of pitch scaling comprising a deposition/trim process at various stages in accordance with various embodiments, wherein FIG. 1A illustrates a cross sectional view of the incoming substrate comprising a patterned photoresist layer, FIG. 1B illustrates a top view of the incoming substrate, FIG. 1C illustrates a cross sectional view of the substrate after a first deposition step of the deposition/trim process, FIG. 1D illustrates a cross sectional view of the substrate after a first trim step of the deposition/trim process, FIG. 1E illustrates a cross sectional view of the substrate after transferring a pattern to a middle layer, FIG. 1F illustrates a cross sectional view of the substrate after transferring the pattern to an underlying layer.

FIGS. 2A and 2B illustrate cross sectional views of example substrates after the process of pitch scaling in accordance with alternate embodiments, wherein FIG. 2A illustrates the substrate with narrow trenches in accordance with an embodiment, and FIG. 2B illustrates the substrate with multiple critical dimensions (CD) of lines in accordance with another embodiment;

FIGS. 3A-3C illustrate cross sectional views of example substrates after a trim step of the deposition/trim process with different degrees of trimming, wherein FIG. 3A illustrates the substrate in accordance with an embodiment, FIG. 3B illustrates the substrate in accordance with another embodiment, and FIG. 3C illustrates the substrate in accordance with yet another embodiment;

FIGS. 4A and 4B illustrate cross sectional views of another example substrate before and after a first deposition step in accordance with an alternate embodiment, wherein FIG. 4A illustrates the substrate after etching a middle layer and before the first deposition step, and FIG. 4B illustrates the substrate after the first deposition/trim cycle;

5A illustrates the substrate after etching a middle layer and a portion of a planarization layer, and before the first deposition step, and FIG. 5B illustrates the substrate after the first deposition/trim cycle;

FIGS. 6A and 6B illustrate cross sectional views of another example substrate before and after a first deposition step in accordance with yet another embodiment, wherein FIG. 6A illustrates the substrate after etching a middle layer and a planarization layer, and before the first deposition step, and FIG. 6B illustrates the substrate after the first deposition/trim cycle;

FIGS. 7A-7C illustrate cross sectional views of yet another example substrate in accordance with an embodiment of quadruple patterning, wherein FIG. 7A illustrates the substrate after a first pitch scaling process, FIG. 7B illustrates the substrate during a second pitch scaling process, and FIG. 7C illustrates the substrate after the second pitch scaling process and a subsequent pattern transfer process; and FIGS. 8A-8D illustrate process flow charts of methods of pitch scaling comprising a deposition/trim process in accordance with various embodiments, wherein FIG. 8A illustrates some embodiment process flows, FIG. 8B illustrates alternate embodiment process flows, FIG. 8C illustrates yet other embodiment process flows, and FIG. 8D illustrates another embodiment process flow.

DETAILED DESCRIPTION OF ILLUSTRATIVE EMBODIMENTS

This application relates to a method of processing a substrate, more particularly to doubling the pitch formed from a process, for example, a single lithographic exposure. In general, various multiple patterning techniques are used for pitch scaling. For example, in a litho-etch-litho-etch (LELE) process, a second lithographic exposure is used to split the feature formed by the first lithographic exposure. Another technique called self-aligned double patterning (SADP) involves spacer formation on the sidewalls of the first feature. However, these techniques of multiple patterning require many complicated steps, often introducing issues of defect and pitch walking (where pitch between features alternates) as well as increased cost due to the additional masking steps.

Embodiments of the present application disclose methods of pitch scaling utilizing a deposition/trim process. In various embodiments, the methods deposit a mask material between adjacent patterned features, the mask material being preferentially deposited in a central portion within a trench between the patterned features. The inventors of this disclosure identified that the deposition rate of the mask material may be location dependent in the trench, for example, faster in the central portion of the trench than at peripheral portions. Further, a trim step of the deposition/trim process may be utilized to avoid undesired deposition at the peripheral portions (edges). As a result, mask material deposited in the central portion can divide the trench. Accordingly, in a subsequent etch step, both the existing feature and the deposited mask material may be used as an etch mask to pattern an underlying layer, resulting in pitch scaling.

Figure 2A:
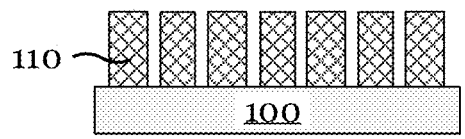
Figure 2B:
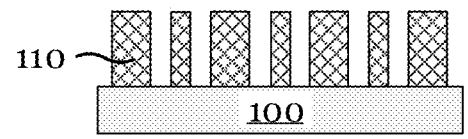
Figure 3A:
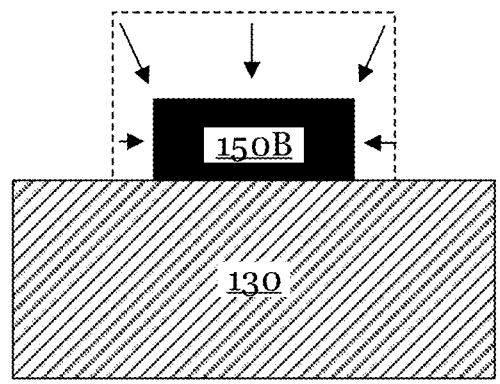
Figure 3B:
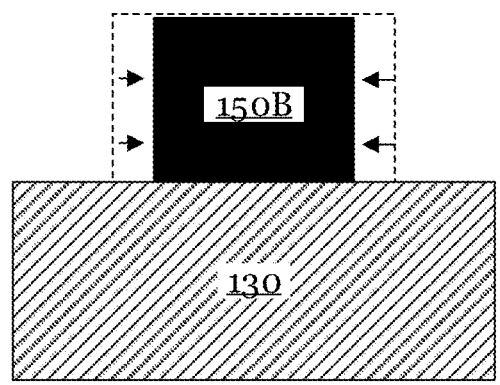

In the following, steps of a pitch scaling method comprising a deposition/trim process are first described referring to FIGS. 1A-1G in accordance with various embodiments. The effect of a trim step of the deposition/trim process of the pitch scaling method is illustrated in FIGS. 3A-3B, and described together with FIG. 1D. FIGS. 2A-2B then illustrate alternate features enabled by the pitch scaling method in other embodiments. Various embodiments of the pitch scaling method applied for various layers of a layer stack are described in FIGS. 4A-4B, 5A-5B, and 6A-6B. An embodiment of the pitch scaling method applied in quadruple patterning is described referring to FIGS. 7A-7C. Example process flow diagrams are illustrated in FIG. 8A-8D. All figures in this disclosure are drawn for illustration purpose only and not to scale, including the aspect ratios of features.

FIGS. 1A-1F illustrate an example substrate 100 during various stages of an example pitch scaling process in accordance with various embodiments.

Figure 1A:
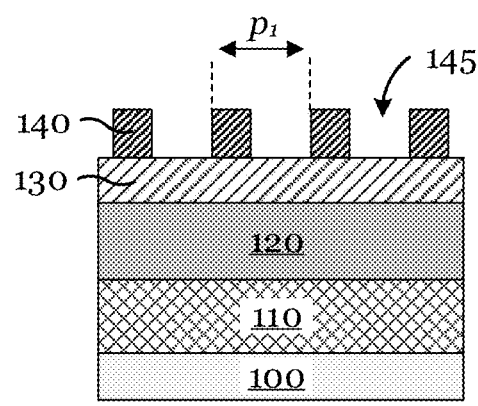
Figure 1B:
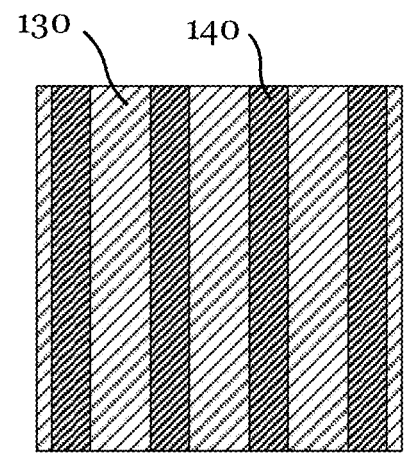

FIG. 1A illustrates a cross sectional view of the incoming substrate 100 having a layer stack comprising an underlying layer 110, an organic planarization layer (OPL) 120, a middle layer 130, and a patterned photoresist layer 140. The layer stack illustrated in FIG. 1A is an example and other layer stack structures may be possible. FIG. 1B illustrates a top view of the incoming substrate 100 illustrated in FIG. 1A.

In various embodiments, the substrate 100 may be a part of, or include, a semiconductor device, and may have undergone a number of steps of processing following, for example, a conventional process. The substrate 100 accordingly may comprise various semiconductor regions for forming active semiconductor regions as well as other regions for interconnecting the active regions and isolating regions.

In some embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In some embodiments, the substrate 100 may be embedded in another substrate of the semiconductor device.

As illustrated in FIG. 1A, the underlying layer 110 may be formed over the substrate 100. In various embodiments, the underlying layer no may be a layer to be patterned. The underlying layer 110 may comprise an oxide, amorphous silicon, polysilicon, or other dielectric materials useful in semiconductor fabrication. The oxide may include carbon, hydrogen, and nitrogen in various embodiments. In some embodiments, the underlying layer 110 may comprise silicon oxide that may be prepared, for example, by plasma-enhanced CVD or flowable CVD using tetraethyl orthosilicate (TEOS) as a precursor. In certain embodiments, the underlying layer no may comprise a metal hard mask layer such as titanium nitride, titanium oxide, and hafnium oxide among others.

In various embodiments, the organic planarization layer (OPL) 120, the middle layer 130, and the patterned photoresist layer 140 may be a tri-layer stack used for a lithographic process as described herein. The OPL 120 may be formed over the underlying layer 110. In various embodiments, the OPL 120 comprises a polymeric material. In one embodiment, the OPL 120 may comprise an amorphous carbon. The OPL 120 may be formed by a wet process, for example, a spin-on process. In certain embodiments, a vapor deposition including plasma enhanced CVD (PECVD) and chemical vapor deposition (CVD), physical vapor deposition (PVD), and atomic layer deposition (ALD) may be used for depositing the OPL 120.

The middle layer 130 may be formed over the OPL 120. The middle layer 130 may comprise an anti-reflective coating (ARC) layer. In some embodiments, the middle layer 130 may comprise a silicon-containing anti-reflective coating (SiARC) film. In some embodiments, the middle layer 130 may be a layer stack comprising a plurality of stacked layers. In one embodiment, the middle layer 130 may comprise the ARC layer and a hard mask layer such as silicon nitride. In another embodiment, the middle layer 130 may comprise silicon carbide, a bottom ARC (BARC) layer, low temperature oxide (LTO), amorphous silicon, or silicon oxynitride. The middle layer 130 may be formed by a wet process, for example, a spin-on process or a dry deposition process.

The patterned photoresist layer 140 formed over the middle layer 130 may provide a first pattern with a first pitch $p_1$ to be doubled. In the illustrated example in FIG. 1A, the first pattern comprises a plurality of lines separated by a plurality of first recesses 145, and the first pitch $p_1$ is equal to the distance from an edge of a line to that of an adjacent line (i.e., the sum of the width of one of the line and the width of one of the first recesses 145 in FIG. 1A).

In some embodiments, as illustrated in FIG. 1B, the plurality of lines of the patterned photoresist layer 140 is formed parallel to each other. In other embodiments, other patterns may include common blocks, for example, lines aligned perpendicular to the illustrated plurality of lines, e.g., U-shaped lines.

In various embodiments, a variety of photolithography techniques may be utilized to pattern a photoresist layer. Examples of photolithography techniques include, but are not limited to, immersion deep ultraviolet (i-DUV) lithography, 13.5 nm wavelength extreme ultraviolet (EUV) lithography, or a combination of lithography and etch steps. In various embodiments, a photoresist may be first deposited over the middle layer 130 using a dry process or wet process, for example, a spin-coating technique. The deposited photoresist may be then patterned with an appropriate lithographic process to form the patterned photoresist layer 140. Depending on the type of lithography used, a variety of photoresist materials may be used. In certain embodiments, the patterned photoresist layer 140 may comprise 248 nm resists, 193 nm resists, 157 nm resists, EUV (extreme ultraviolet) resists, or electron beam (EB) sensitive resists. The photoresist material used for the patterned photoresist layer 140 may also be a chemically amplified photoresist based on an acid-catalyzed or base-catalyzed material. In one embodiment, the patterned photoresist layer 140 has a thickness between 10 nm and 100 nm. In some embodiments, the first pitch $p_1$ may be between 28 nm and 200 nm. In some embodiments, the first pitch $p_1$ may be close to the resolution limit of a single lithographic exposure used in patterning the patterned photoresist layer 140, and the pitch scaling may advantageously enable feature sizes below the resolution limit.

In certain embodiments, an optional pre-deposition etch may be performed to tune the height and/or critical dimension (CD) of the lines of the patterned photoresist layer 140 and thereby those of the first recesses 145 as well.

Figure 1C:
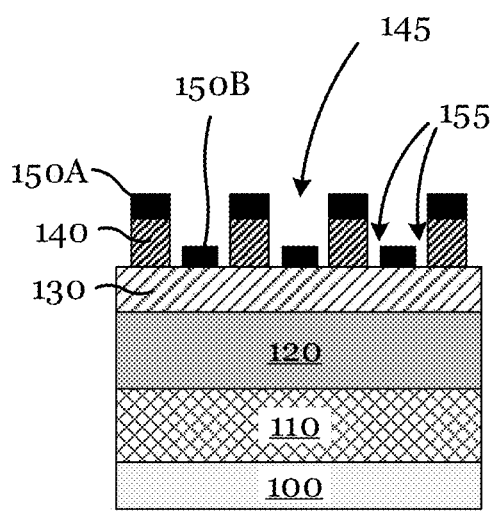

FIG. 1C illustrates a cross-sectional view of the substrate wo after a first deposition step of the deposition/trim process in accordance with an embodiment.

As illustrated in FIG. 1C, in various embodiments, during the first deposition step of the deposition/trim process, a mask material is deposited both over the patterned photoresist layer 140 and over a portion of the first recesses 145, for example, central portions at the bottom surfaces of the first recesses 145 illustrated in FIG. 1C. In this disclosure, the mask material deposited over the patterned photoresist layer 140 is referred to as a top mask 150A, and the mask material deposited over the bottom surfaces of the first recesses 145 is referred to as a bottom mask 150B. The top mask 150A and the bottom mask 150B collectively form a second pattern over the first pattern provided by the patterned photoresist layer 140. The inventors of this disclosure identified that, during the deposition step, the deposition rate of the mask material may be location dependent, for example, faster in the central portions of the first recesses 145 than at peripheral regions (edges) of the first recesses 145. This dependency of the deposition rate may be attributed to non-uniform precursor fluxes into the first recesses 145. Although not wishing to be limited by any theory, for example, the delivery of the precursors to the edges of the first recesses 145 may be hampered by the sidewalls of the patterned photoresist layer 140. With the bottom mask 150B deposited only on the central portions, each of the first recesses 145 may be divided into two second recesses 155, doubling the number of recesses in the feature. In the illustrated example of FIG. 1C, six new recesses (i.e., the second recesses 155) are formed from the three recesses (i.e., the first recesses 145 in FIG. 1A) after the first deposition step of the deposition/trim process. As a result, it is possible to realize pitch scaling through a single deposition step without performing additional processes that may be necessary in conventional methods such as a litho-etch-litho-etch (LELE) process and self-aligned double patterning (SADP). Advantageously, the formation of the bottom mask 150B of the second pattern is confined within the first recesses 145. This confinement of the bottom mask 150B therefore may alleviate the issue of pitch walking that may be a challenge in LELE process.

In various embodiments, the pitch scaling process relies on the formation of the second pattern that divides each of the first recesses 145. The deposition/trim process to form the second pattern is location dependent, and the aspect ratio (AR) of the patterned photoresist layer 140 and/or the height of the first recesses 145 may be a critical factor for the location dependency. For example, increasing the AR of the patterned photoresist layer 140 (thereby increasing the height of the first recesses 145 in FIG. 1A) may enhance the shadowing effect during the deposition step and result in a smaller CD of the bottom mask 150B. Accordingly, conditions of forming the patterned photoresist layer 140 and the optional pre-deposition etch described above may be optimized in consideration of the AR of the patterned photoresist layer 140.

In various embodiments, the mask material may be an organic material, dielectric material, or silicon. In certain embodiments, the mask material may comprise a photoresist material. In various embodiments, the deposition of the mask material may be performed using a deposition gas comprising $C_xH_y/N_2/Ar/He/SiCl_4$ precursors. In some embodiments, the deposition gas may comprise $CH_4$. The deposition of the mask material may be performed by deposition techniques such as vapor deposition including plasma enhanced CVD (PECVD), chemical vapor deposition (CVD), physical vapor deposition (PVD), and atomic layer deposition (ALD), sputtering, and other processes. In various embodiments, the deposition of the mask material may be performed in a plasma etch chamber configured to perform various etch processes.

Figure 1D:
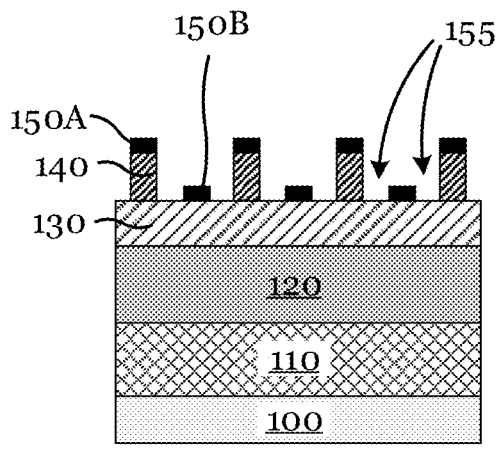

FIG. 1D illustrates a cross sectional view of the substrate 100 after a first trim step of the deposition/trim process in accordance with an embodiment.

Figure 3C:
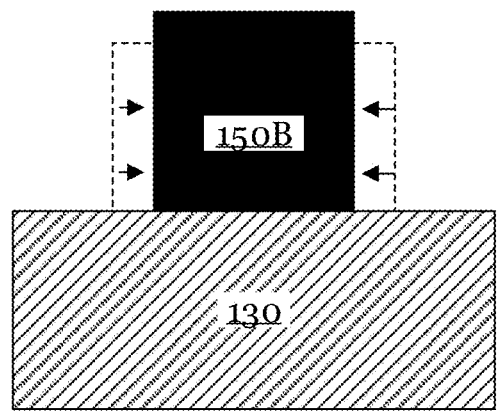

FIGS. 3A-3C illustrate magnified cross sectional views of example substrates after a trim step of the deposition/trim process with different degrees of trimming of the bottom mask 150B.

The trim step of the deposition/trim process may be performed to thin the critical dimensions (CD) of the top mask 150A and the bottom mask 150B by removing some of the mask material deposited in the first deposition step. In various embodiments, as illustrated in FIG. 1D, the trim step may also laterally etch the patterned photoresist layer 140, the top mask 150A and the bottom mask 150B, widening the width of the second recesses 155. The trim step of the deposition/trim process may be particularly useful in realizing the desired CD of the mask material for subsequent steps. In some embodiments, the trim step may preferentially etch more of the patterned photoresist layer 140 or the bottom mask 150B. Although not illustrated in FIG. 1C, certain embodiments may rely primarily on the trim step to realize the second recesses 155. In such embodiments, the mask material covers all of the bottom surfaces of the first recesses 145.

In various embodiments, the trim step may be performed by, for example, reactive ion etching (RIE) using a trim gas comprising $CO_2$/CO/$CH_4$/$O_2$/$N_2$/$H_2$/fluorocarbon/HBr/Cl, and others. In certain embodiments, the processes of the deposition step and the trim step may be selected to be substantially similar for improving throughput. For example, embodiments include switching from the deposition step to the trim step by adding/removing one of the gases and/or (simultaneously) switching the biasing scheme quickly. In one illustrative embodiment, the mask material may be an organic material, for example, formed using a $C_xH_y$ type precursor with diluent gases such as Ar, $N_2$, He, $H_2$ during the deposition step and the trimming of the mask material may be performed by an ash chemistry such as $N_2$, $H_2$, $CO_2$, CO, $O_2$, Ar, He type chemistries or alternatively wet chemistries.

In various embodiments, the trimming process may include a local etch variation that causes the etch rate to be higher locally. For example, the trim step may involve micro trenching, where the etch rate is higher near the sidewall in a recess. This may be attributed to reflections of high energy particles at the sidewall and the etching may be more focused near the corners of the recess although other mechanisms may also be possible. In various embodiments, such local etching may be utilized in the trim step of the deposition/trim process to allow the tuning of the critical dimension (CD) of the mask material while preventing the complete loss of the bottom mask 150B. As an illustration, in some embodiments, the first deposition step may conformally cover the entire bottom surfaces of the first recesses 145 with the mask material. The trim step of the deposition/trim process then may advantageously be performed to create the second recesses 155 by locally etching the mask material near the sidewalls of the patterned photoresist layer 140 as well as tune the CD of the formed second recesses 155.

In FIG. 3A, the trimming of the bottom mask 150B is illustrated in accordance with certain embodiments. The area defined by the dotted line illustrates the initial outer edge of the bottom mask 150B after the deposition step and before the trim step. As illustrated, both the height and CD of the bottom mask 150B may be reduced during the trim step. In some embodiments, the change in height may be greater than the change in CD. In other embodiments, however, the change in height may be less than the change in CD as illustrated in FIG. 3B. Micro trenching as described above may be used to tailor the final dimensions of the bottom mask 150B. Further, in some embodiments, the process conditions may be selected to minimize the change in height of the bottom mask 150B. In further embodiments, as illustrated in FIG. 3C, the mask material may be selectively deposited to grow the bottom mask 150B in height while maintaining the lateral etch characteristic of the trim step to shrink the CD of the bottom mask 150B.

In various embodiments, the deposition step and the trimming step may be repeated as part of a cyclic process to achieve the desired height and CD of the top mask 150A and the bottom mask 150B. The cyclic embodiments of the deposition/trim process may be particularly advantageous if one deposition step cannot deposit sufficient amount of the mask material or the difference in deposition rate in the first recesses 145 is not large enough to divide the first recesses 145 with the bottom mask 150B. By repeating the deposition step and the trimming step, the desired profile of the top mask 150A and the bottom mask 150B, including the CD and the aspect ratio, may be obtained. In another embodiment, the first deposition step may provide the desired profile of the mask material and the trim step may be skipped.

In certain embodiments, during or after the deposition/trim process, a smoothening process may optionally be performed to reduce the roughness of the surface of the mask material, for example, line edge roughness (LER). In some embodiments where the mask material comprises a polymeric material such as a resist material, the smoothening process may comprise a curing process to induce chemical reactions in the polymeric material. For example, the curing process may be a plasma process using a gas comprising HBr, $H_2$, Ar, $N_2$, or He in one embodiment. Direct current superposition technology (DCS) using an electron beam (EB) may also be used in another embodiment for curing the mask material. In certain embodiments, the smoothening process may be integrated into one or more of the trip steps by modifying the process conditions for the trim steps.

Figure 1E:
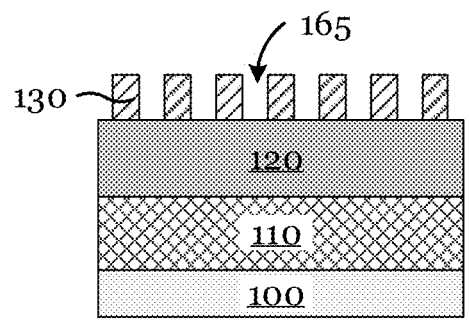

FIG. 1E illustrates a cross-sectional view of the substrate wo after patterning the middle layer 130 in accordance with an embodiment.

After the deposition/trim process achieves the desired height and CD of the mask material (e.g., the top mask 150A and the bottom mask 150B in FIG. 1D), a pattern transfer etch is performed to pattern the middle layer 130 to form third recesses 165 having a pattern corresponding to the pattern of the second recesses 155. In some embodiments, the pattern transfer etch comprises an anisotropic etching process, such as reactive ion etching (RIE), or any other removal process known within the art. In some embodiments, an optional removal step, for example, an ashing process, may remove the remaining portions of the patterned photoresist layer 140 and the mask material after the pattern transfer etch.

Figure 1F:
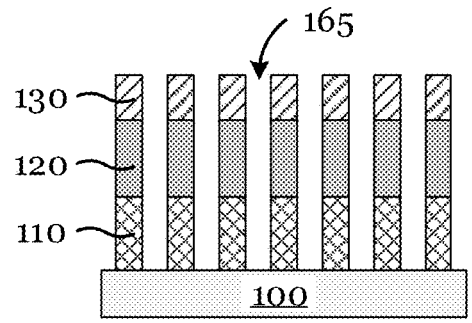

FIG. 1F illustrates a cross-sectional view of the substrate wo after patterning the underlying layer 110 in accordance with an embodiment.

The pattern transfer etch described above may further transfer the pattern to the underlying layer 110 by etching both the organic planarization layer (OPL) 120 and the underlying layer 110, further extending the third recesses 165. In certain embodiments, one continuous etch process may be performed to pattern the layer stack of the middle layer 130, the OPL 120, and the underlying layer 110. In other embodiments, two or more pattern transfer etch processes and/or conditions may be employed to pattern the layer stack.

Figure 1G:
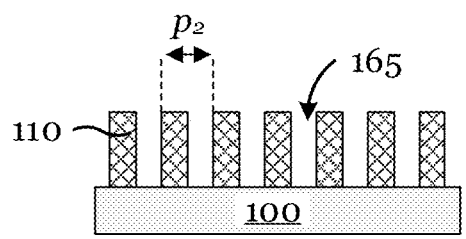
FIG. 1G illustrates a cross sectional view of the substrate after a removal of the remaining layers.

FIG. 1G illustrates a cross-sectional view of the substrate wo after a removal of the remaining layers in accordance with an embodiment.

The remaining portions of layers (e.g., the middle layer 130 and the OPL 120) may be removed at this stage by an optional removal step, for example, an RIE process. The resulting pattern formed in the underlying layer 110 has a second pitch $p_2$ that is approximately half of the first pitch $p_1$ in FIG. 1A. In various embodiments, the pitch scaling may be performed to form the second pitch $p_2$ comprising 1:1 line-to-space ratio (i.e., the width of one of the line is equal to the width of one of the third recesses 165 in FIG. 1G).

FIGS. 2A and 2B illustrate cross sectional views of example substrates 100 after the pitch scaling process in accordance with alternate embodiments.

As described above, the feature to be formed in the underlying layer 110 may be determined by the first pattern provided by the patterned photoresist layer 140 and the second pattern provided by the deposition/trim process. Accordingly, by optimizing the process conditions for the patterning of the patterned photoresist layer 140 and/or the deposition/trim process advantageously enables various features below the resolution limit of a single lithographic exposure. For example, the line-to-space ratio may be other than 1:1. FIG. 2A illustrates the substrate 100 with narrow recesses in accordance with an embodiment, where the width of space is less than the width of the line. FIG. 2B illustrates the substrate 100 with multiple critical dimensions (CD) of lines in accordance with another embodiment.

In the embodiments described above referring to FIGS. 1A-1G and 2A-2B, the deposition/trim process is employed before patterning the middle layer 130, but it may be performed at different stages in other embodiments. For example, the deposition/trim process may be performed between pattern transfer etches to pattern the middle layer 130 or the organic planarization layer (OPL) 120.

Figure 4A:
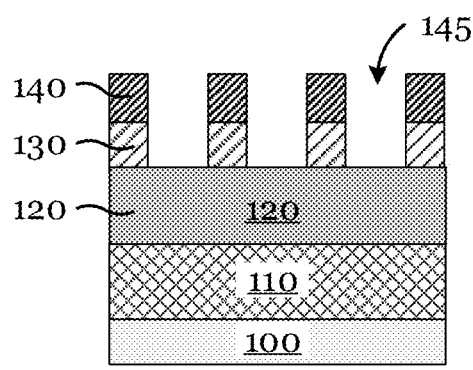
Figure 4B:
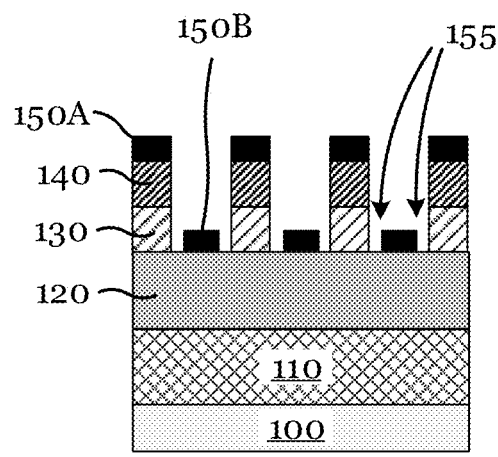

FIGS. 4A and 4B illustrate cross sectional views of an example substrate 100 before and after a first deposition step in accordance with an alternate embodiment. All features of the substrate 100 and the associated layers except a pattern of a middle layer 130 are the same as illustrated previously in FIG. 1A, and thus are not repeated below.

In FIG. 4A, prior to a deposition/trim process, a first pattern transfer etch may be performed to etch the middle layer 130 so that the first pattern of the patterned photoresist layer 140 is first transferred to the middle layer 130. The first pattern transfer etch thus extends the first recesses 145 into the middle layer 130, increasing the aspect ratio of the first recesses 145. The OPL 120 may be exposed at the bottom of the extended first recesses 145 as illustrated.

FIG. 4B illustrates the substrate 100 after the first deposition step of the deposition/trim process. The top mask 150A and the bottom mask 150B provides the second pattern. Unlike the prior embodiments, the bottom mask 150B may be directly deposited on and in contact with the OPL 120. Because of the different aspect ratio of the first recesses 145 and/or possible difference in the surface chemistry, the deposition profile of the bottom mask 150B may be altered from the prior embodiments. Such differences may advantageously help, for example, forming the bottom mask 150B with smaller critical dimension (CD) in the first deposition step. Further, in some embodiments, the compositions of the top mask 150A and the bottom mask 150B may be different. Similar to the prior embodiments, the deposition/trim process may be repeated as part of a cyclic process to achieve the desired height and CD of the mask material.

After completing the deposition/trim process, a second pattern transfer etch may be performed to pattern the OPL 120 and an underlying layer 110 as previously described above (e.g., FIGS. 1E-1G).

Figure 5A:
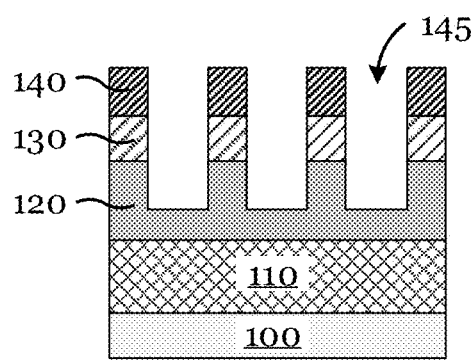
FIGS. 5A and 5B illustrate cross sectional views of another example substrate before and after a first deposition step in accordance with another embodiment, wherein FIG.
Figure 5B:
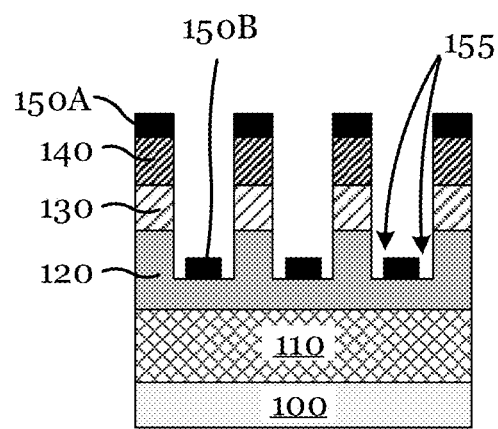

FIGS. 5A and 5B illustrate cross sectional views of an example substrate 100 before and after a first deposition step in accordance with another embodiment. All features of the substrate 100 and associated layers except patterns of a middle layer 130 and an OPL 120 are the same as illustrated previously in FIG. 1A, and thus are not repeated below.

In FIG. 5A, prior to a deposition/trim process, a first pattern transfer etch may be performed to etch the middle layer 130 and a portion of the OPL 120 so that the first pattern of the patterned photoresist layer 140 is transferred to the middle layer 130 and the portion of the OPL 120. The first pattern transfer etch thus extends the first recesses 145 into the OPL 120. However, the first recesses 145 in the OPL 120 do not expose the underlying layer 110.

FIG. 5B illustrates the substrate 100 after the first deposition step of the deposition/trim process. The bottom mask 150B may be directly deposited on and in contact with the OPL 120. The different aspect ratio of the first recesses 145 may affect the deposition profile of the bottom mask 150B. In some embodiments, because the first recesses 145 is deeper than those in FIG. 4B, a CD of the bottom mask 150B smaller than that in FIG. 4B may be achieved during the first deposition step. After completing the deposition/trim process, a second pattern transfer etch may be performed to further pattern the remaining OPL 120 and the underlying layer 110 as previously described above (e.g., FIGS. 1E-1G).

Figure 6A:
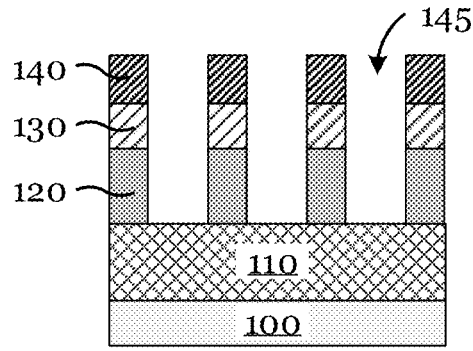
Figure 6B:
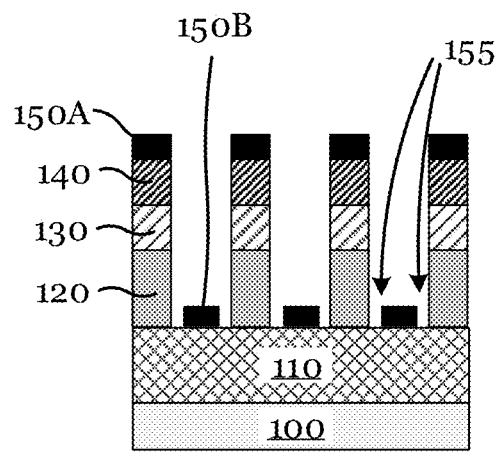

FIGS. 6A and 6B illustrate cross sectional views of an example substrate 100 before and after a first deposition step in accordance with yet another embodiment. All features of the substrate 100 and associated layers except patterns of a middle layer 130 and an OPL 120 are the same as illustrated previously in FIG. 1A, and thus are not repeated below.

In FIG. 6A, prior to a deposition/trim process, a first pattern transfer etch may be performed to etch the middle layer 130 and the OPL 120 so that the first pattern of the patterned photoresist layer 140 is transferred to the middle layer 130 and the OPL 120. The first pattern transfer etch thus extends the first recesses 145 into the OPL 120. In this embodiment, the first pattern transfer etch exposes an underlying layer 110 at the bottom of the first recesses 145.

FIG. 6B illustrates the substrate 100 after the first deposition step of the deposition/trim process. The bottom mask 150B may be directly deposited on and in contact with the underlying layer 110. As described above, the different aspect ratio of the first recesses 145 may affect the deposition profile of the bottom mask 150B. In addition to the effect of topology, surface chemistry may also play a role in impacting the deposition profile. For example, in some embodiments where the patterned photoresist layer 140 comprises an organic photoresist material and the underlying layer 110 comprises silicon oxide, the surface chemistry with the mask material being deposited may be different between the organic photoresist and the oxide. Consequently, different deposition rates and/or different compositions between the top mask 150A and the bottom mask 150B may be achieved. After completing the deposition/trim process, a second pattern transfer etch may be performed to pattern the underlying layer 110 as previously described above (e.g., FIGS. 1E-1G).

In the above embodiments illustrated in FIGS. 4A-6B, the first pattern transfer etch is performed to extend the first recesses 145 using the patterned photoresist layer 140 as an etch mask, prior to the deposition/trim process. The remaining photoresist after the first pattern transfer etch is illustrated in FIGS. 4A, 5A, and 6A, and accordingly the top mask 150A is formed over the remaining photoresist as illustrated in FIGS. 4B, 5B, and 6B. It should be noted, however, that the photoresist may be consumed during the first pattern transfer etch or an optional step may remove the photoresist in certain embodiments. Therefore, the top mask 150A may be formed directly contacting the middle layer 130 in some embodiments. Such embodiments may advantageously enable utilizing different surfaces other than the photoresist used for the patterned photoresist layer 140 for the deposition of the top mask 150A.

Further, the embodiments described above assume the mask material is deposited on two surface levels of the substrate 100, thereby forming the top mask 150A and the bottom mask 150, but other embodiments may be envisioned for a substrate having more than two surface levels and the mask material may be deposited on different surface levels. Similarly, any initial topology on the substrate may be potentially utilized for creating a new pattern by a deposition/trim process described in this disclosure. Although the methods herein are described for pitch scaling, embodiments of the method should not be limited to doubling the number of pitches (i.e., the number of lines/recesses in an area) and the increase of the number of pitches by any factor may be envisioned by this disclosure. For example, in some embodiments, the pitch scaling process may be repeated to twice to enable quadruple patterning (FIGS. 7A-7C).

Figure 7A:
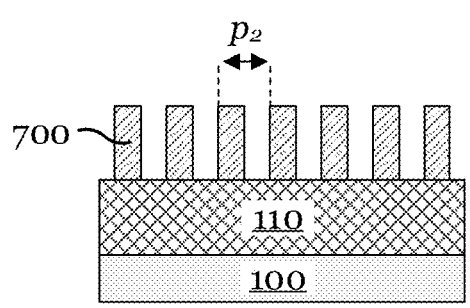
Figure 7B:
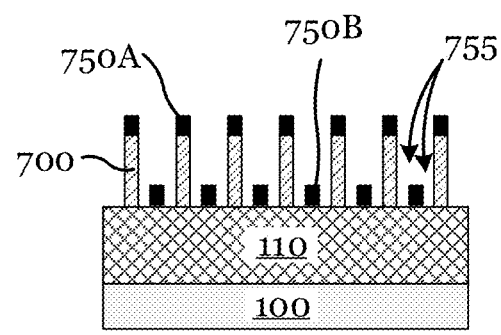
Figure 7C:
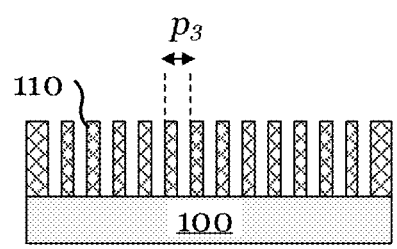

FIGS. 7A-7C illustrate cross sectional views of an example substrate 100 in accordance with an embodiment of quadruple patterning.

FIG. 7A illustrates a cross sectional view of the substrate 100 after a first pitch scaling process. In FIG. 7A, a first layer to be patterned 700 is patterned by the first pitch scaling process as already described above (e.g., FIGS. 1A-1G). Accordingly, the pattern formed in the first layer to be patterned 700 has a second pitch $p_2$, which is approximately half of the first pitch $p_1$ in FIG. 1A. A second pitch scaling process may be performed to pattern an underlying layer 110.

FIG. 7B illustrates the substrate 100 during the second pitch scaling process.

The second pitch scaling process may be performed in the same way as the first pitch scaling process as already described above (e.g., FIGS. 1A-1D), although the process conditions of the deposition/trim process may be different in some embodiments. Second top mask 750A and second bottom mask 750B are formed during the deposition step. Recesses 755 are also formed. The height and critical dimension (CD) are tuned by the trim step or a cyclic process of deposition/trim steps.

FIG. 7C illustrates the substrate 100 after the second pitch scaling process and a subsequent pattern transfer process.

The subsequent pattern transfer process follows the second pitch scaling process to pattern the underlying layer 110. As a result, the number of lines is quadrupled from the initial pattern provided in FIG. 1A. The resulting feature in the underlying layer has a third pitch $p_3$ that is approximately half of the second pitch $p_2$ (thereby approximately a quarter of the first pitch $p_1$ in FIG. 1A)

FIGS. 8A-8D illustrate process flow charts of methods of pitch scaling comprising a deposition/trim process in accordance with various embodiments. The process flow can be followed with the figures (FIGS. 1A-1G, 4A-4B, 5A-5B, and 6A-6B) discussed above and hence will not be described again.

Figure 8A:
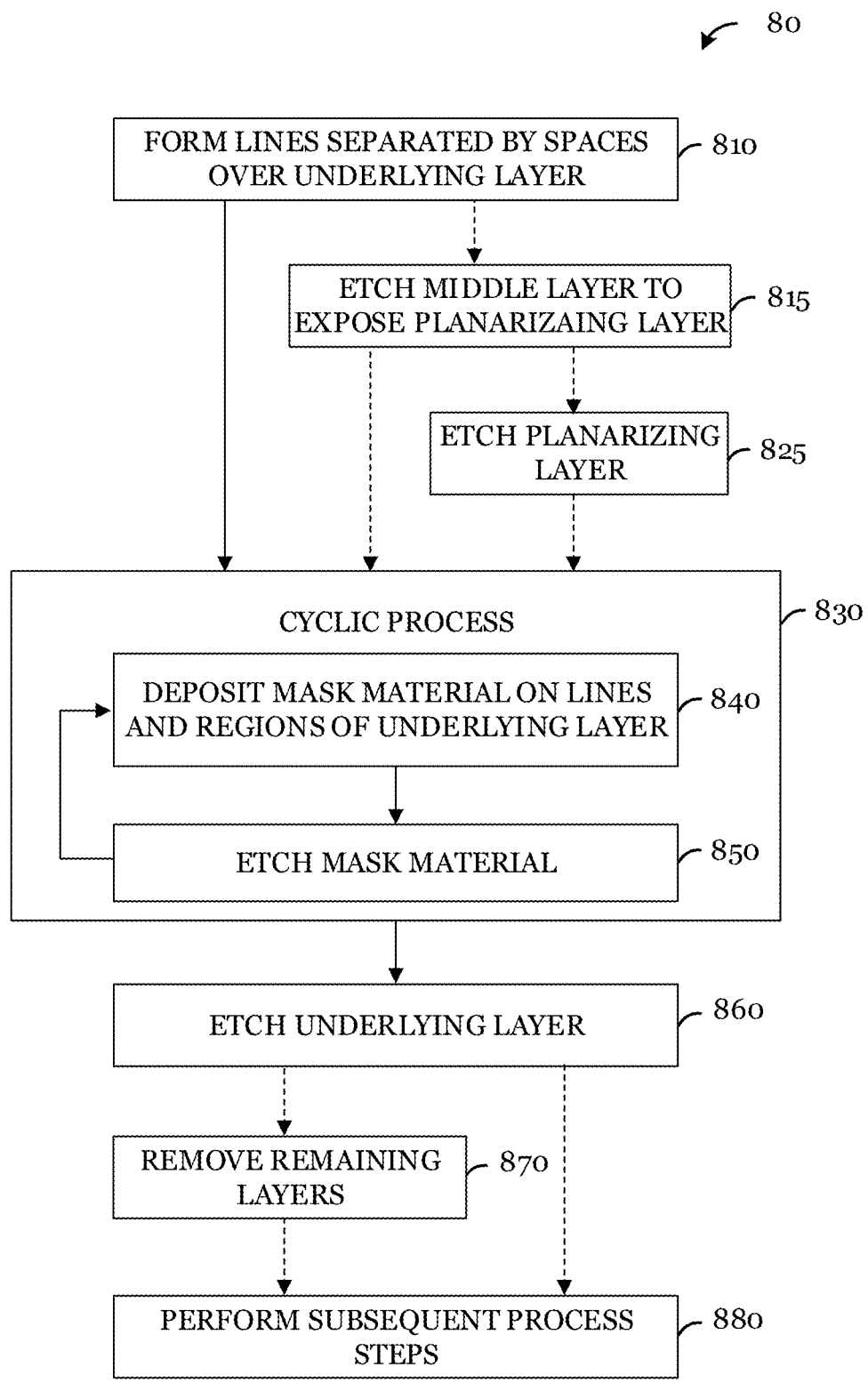

In FIG. 8A, a process flow 80 starts with forming a first plurality of lines comprising a first material, separated by a first plurality of recesses (block 810, FIG. 1A). Next, a cyclic process may be performed (block 830), where the cyclic process comprises depositing a mask material on the first plurality of lines and a plurality of regions within the first plurality of recesses (block 840, FIG. 1C), and etching the mask material (block 850, FIG. 1D). In certain embodiments, prior to the cyclic process (block 830), an optional pattern transfer etch may be performed. The optional transfer etch may comprise etching a middle layer to expose a planarization layer (block 815, FIG. 4A) or etching the middle layer and the planarization layer (block 825, FIGS. 5A and 6A). After the cyclic process (block 830), an underlying layer may be etched using the mask material as an etch mask (block 860, FIG. 1D). An optional removal step may be performed to remove the remaining layers of the middle layer and planarizing layer (block 870). Subsequent process steps may then be performed (block 880), for example, to fabricate logic devices, micro-electro-mechanical systems (MEMS), or optoelectronic components. Examples of the subsequent process steps include various etching processes such as reactive ion etching (RIE) and/or cleaning steps such as a wet cleaning process.

Figure 8B:
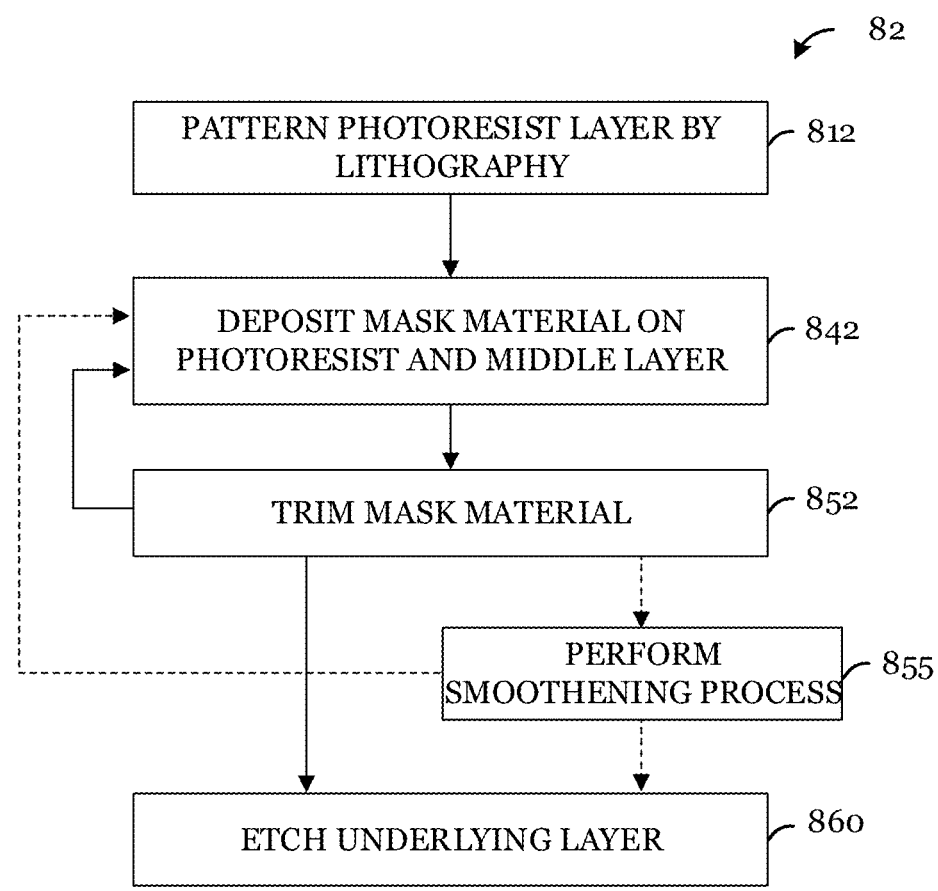

In FIG. 8B, a process flow 82 starts with patterning a photoresist layer by a lithographic process to form one or more recesses in the photoresist layer (block 812, FIG. 1A). Next, a mask material may be deposited on the photoresist layer and the middle layer (block 842, FIG. 1C), followed by trimming a portion of the mask material (block 852, FIG. 1D). In certain embodiments, the depositing and the trimming may be repeated as part of a cyclic process. In some embodiments, during or after the cyclic process, an optional smoothening process may be performed to reduce the roughness of the pattern of the mask material (block 855). Lastly, an underlying layer may be etched using the mask material as an etch mask (block 860, FIG. 1F).

Figure 8C:
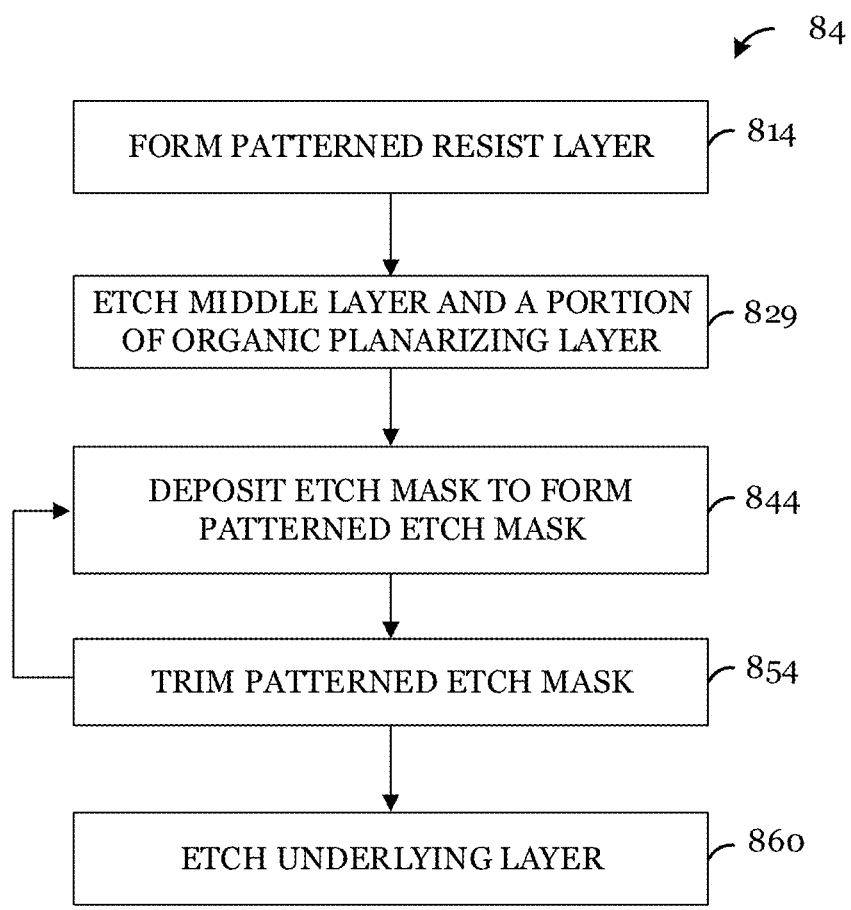

In FIG. 8C, a process flow 84 starts with a lithography process to form a patterned resist layer over a substrate comprising a to-be-patterned layer, an organic planarization layer (OPL) over the to-be-patterned layer, and a middle layer over the OPL (block 814, FIG. 1A). Next, patterned recesses may be formed in the OPL by etching the middle layer and a portion of the OPL using the patterned resist layer as an etch mask (block 829, FIG. 5A). An etch mask may then be deposited to form a patterned etch mask layer (block 844, FIG. 5B), followed by trimming the patterned etch mask (block 854). In certain embodiments, the depositing and the trimming may be repeated as part of a cyclic process. Lastly, an underlying layer may be etched using the mask material as an etch mask (block 860, FIG. 1F).

Accordingly, the methods described in this disclosure may advantageously enable a simpler method of pitch scaling that avoids additional lithographic processes and spacer formation. Embodiments thus help reduce fabrication costs compared to conventional methods. In addition, various embodiments of the pitch scaling methods may improve device performance by reducing the issue of pitch walking.

Further, in various embodiments, depending on the topology of the existing feature and the target critical dimension (CD) of feature being formed, the cyclic process can be reconfigured to enable careful control of the spacing and/or height of the mask material being deposited. Embodiments may thus actively control the pitch of the resulting features.

Figure 8D:
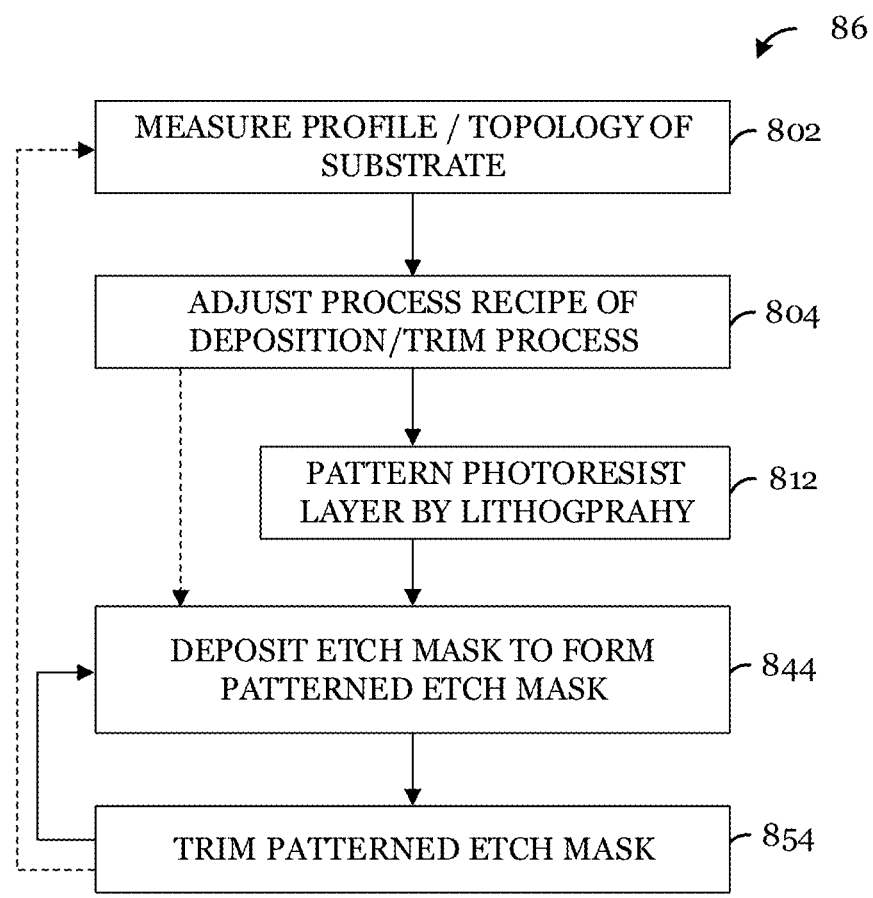

In FIG. 8D, in accordance with some embodiments, a process flow 86 starts with first measuring the topology of the incoming substrate or a batch of substrates (block 802). The measurements may be performed with various metrology techniques such as profilometry, scatterometry, CD-SEM, and others. Based on the information obtained from the measurement, the process recipe of the cyclic process may accordingly be adjusted, e.g., by changing the deposition/trim times, temperatures, gas pressures, and others so as to achieve a target line/recess pattern (block 804). In other embodiments, other parameters of the cyclic process may be changed. As another illustration, any process parameter that changes the characteristic of the deposition relative to the trim process may be used. After patterning a photoresist layer by a lithographic process (block 812, FIG. 1A), the deposition/trim process may be performed with the updated recipe by depositing an etch mask (block 844, FIG. 1C) and trimming the patterned etch mask (block 854, FIG. 1D). In certain embodiments, when repeating the deposition step and the trim step, the measurement of the topology of the substrate may be repeated as part of the cyclic process and the process recipe may be further adjusted.

Embodiments may enable patterning features of different line/recess patterns. For example, patterns with different line CD for a fixed recess width may be formed on the same substrate in some embodiments. Alternatively, the ratio of line CDs to the recess width may be maintained while increasing the line CDs of features on the wafer in some embodiments. In further embodiments, the recess width between features may be changed while maintaining the line CDs.

As described in more detail above, in various embodiments, the pitch scaling methods of this disclosure may also be applied to a layer stack comprising multiple layers, and the deposition/trim process may advantageously be performed at any layer of the layer stack utilizing a pattern transfer etch prior to the deposition/trim process. Enabling multiple patterning with relatively few process steps, various embodiments may particularly be useful for applications in logic devices, micro-electro-mechanical systems (MEMS), or optoelectronic components fabricated from a 200 mm wafer, where advanced lithographic systems (e.g., EUV) may not be easily accessible.

Example embodiments are summarized here. Other embodiments can also be understood from the entirety of the specification as well as the claims filed herein.

Example 1. A method of processing a substrate that includes: forming a first plurality of lines and a first plurality of recesses, each of the plurality of lines being separated from an adjacent one of the plurality of lines by one of the plurality of recesses, the first plurality of lines including a first material and formed over a to-be-patterned layer; performing a cyclic process including a plurality of cycles, each of the plurality of cycles including: depositing a mask material over the first plurality of lines and within the first plurality of recesses, the mask material deposited within the first plurality of recesses defining a second plurality of lines, each of the second plurality of lines dividing one of the first plurality of recesses to form a second plurality of recesses; and performing a trimming process to increase critical dimensions of the second plurality of recesses; and patterning the to-be-patterned layer using the first plurality of lines and the second plurality of lines as an etch mask.

Example 2. The method of example 1, where the first material includes a photoresist and where forming the first plurality of lines is performed by a lithographic process.

Example 3. The method of one of examples 1 or 2, where widths of the critical dimensions of the second plurality of recesses are below a resolution limit of the lithographic process.

Example 4. The method of one of examples 1 to 3, where the mask material includes an organic material, dielectric material, or silicon.

Example 5. The method of one of examples 1 to 4, where the to-be-patterned layer is a layer stack, where the layer stack includes a middle layer, a planarization layer, and a bottom layer, the planarization layer disposed between the middle layer and the bottom layer.

Example 6. The method of example 5, further including, after patterning the layer stack, removing remaining portions of the mask material, the first material, the middle layer, and the planarization layer, the removing forming a third plurality of lines in the bottom layer.

Example 7. The method of one of examples 5 to 6, further including, before performing the cyclic process, etching the middle layer using the first plurality of lines as an etch mask to expose the planarization layer, the middle layer becoming a part of the first plurality of lines.

Example 8. The method of one of examples 5 to 7, further including, before performing the cyclic process, etching the middle layer and a portion of the planarization layer using the first plurality of lines as an etch mask, the middle layer becoming a part of the first plurality of lines.

Example 9. The method of one of examples 5 to 8, further including, before performing the cyclic process, etching the middle layer and the planarization layer using the first plurality of lines as an etch mask to expose the bottom layer, the middle layer and the planarization layer becoming a part of the first plurality of lines.

Example 10. A method of processing a substrate that includes: patterning, using a lithographic process, a photoresist layer formed over a first layer to form a recess in the patterned photoresist layer, a first portion of the first layer exposed at a bottom surface of the recess and a second portion of the first layer being covered by the patterned photoresist layer; forming a pattern including a mask material over the patterned photoresist layer, the forming including: depositing a top mask and a bottom mask, the top mask being deposited to be in contact with the patterned photoresist layer, the bottom mask being deposited to be in contact with the first layer within the first portion, the top and the bottom masks including the mask material; and forming recesses between the patterned photoresist layer and the bottom mask by a trimming process; and transferring the pattern of the mask material to a second layer disposed below the first layer by etching using the top mask and the bottom mask as an etch mask.

Example 11. The method of example 10, where forming recesses includes laterally etching through sidewalls of the patterned photoresist layer during the trimming process.

Example 12. The method of one of examples 10 or 11, where forming the recesses includes etching the mask material along sidewalls of the bottom mask during the trimming process.

Example 13. The method of one of examples 10 to 12, further including performing a smoothening process to reduce a surface roughness of a sidewall of the patterned photoresist layer.

Example 14. The method of one of examples 10 to 13, where the top mask and the bottom mask have different compositions.

Example 15. The method of one of examples 10 to 14, where the depositing is performed by a vapor deposition process using a deposition gas including a hydrocarbon, and where the trimming is performed by a dry etch process using an etch gas including oxygen, $H_2$, $CO_2$, $N_2$, CO, or $CH_4$.

Example 16. The method of one of examples 10 to 15, further including: measuring a topology of the substrate; and based on the measuring, updating a process recipe for the forming.

Example 17. A method including: forming, with a lithographic process, a patterned photoresist layer including a first plurality of lines at a first pitch and a first plurality of recesses separating the first plurality of lines from each other; forming, without an additional lithographic process, a etch mask including a first mask disposed on the first plurality of lines and a second mask disposed on the first plurality of recesses; and etching through a to-be-patterned layer using the etch mask to form a second plurality of lines at a second pitch and a second plurality of recesses separating the second plurality of lines from each other, the second pitch being smaller than the first pitch.

Example 18. The method of example 17, where forming the etch mask includes: depositing a mask material to form the first mask and the second mask; and forming, during a trimming process, a third plurality of recesses between the patterned photoresist layer and the second mask, the trimming process laterally etching through sidewalls of the patterned photoresist layer during the trimming process.

Example 19. The method of one of examples 17 or 18, where forming the etch mask includes: depositing a mask material to form the first mask and the second mask; and forming, during a trimming process, a third plurality of recesses between the patterned photoresist layer and the second mask, the trimming process laterally etching the mask material along sidewalls of the second mask during the trimming process.

Example 20. The method of one of examples 17 to 19, where forming the etch mask includes: performing a cyclic process including a plurality of cycles, each of the plurality of cycles including: depositing a mask material over the first plurality of lines and within the first plurality of recesses, the mask material deposited within the first plurality of recesses defining a third plurality of lines, each of the third plurality of lines dividing one of the first plurality of recesses to form a third plurality of recesses; and performing a trimming process to increase critical dimensions of the third plurality of recesses.

Example 21. A method of forming a semiconductor device that includes: forming a layer stack over a substrate, the layer stack including a middle layer, an organic planarization layer (OPL), and a to-be-patterned layer, the OPL being disposed between the middle layer and the to-be-patterned layer; forming a patterned resist layer over the layer stack using a lithography process; forming patterned recesses in the OPL by etching the middle layer and a portion of the OPL using the patterned resist layer as an etch mask, the patterned recesses having the pattern of the patterned resist layer; forming a patterned etch mask layer by depositing a mask material over the patterned recesses, where a rate of the depositing at middle portions of bottom surfaces of the patterned recesses is greater than a rate of the depositing at side portions of bottom surfaces of the patterned recesses; and trimming the patterned etch mask layer, a rate of the trimming at the middle portions is smaller than a rate of the trimming at the side portions.

Example 22. The method of example 21, further including repeating the depositing and the trimming.

Example 23. The method of one of examples 21 or 22, where the etch mask layer includes silicon.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    forming a first plurality of lines and a first plurality of recesses, each of the first plurality of lines being separated from an adjacent one of the first plurality of lines by one of the first plurality of recesses, the first plurality of lines comprising a first material and formed over a to-be-patterned layer;
    performing a cyclic process comprising a plurality of cycles, each of the plurality of cycles comprising:
        depositing a mask material within the first plurality of recesses, the mask material deposited within the first plurality of recesses defining a second plurality of lines, each of the second plurality of lines dividing one of the first plurality of recesses to form a second plurality of recesses; and
        performing a trimming process to increase critical dimensions of the second plurality of recesses; and
    patterning the to-be-patterned layer using the first plurality of lines and the second plurality of lines as an etch mask.

2. The method of claim 1, wherein the first material comprises a photoresist and wherein forming the first plurality of lines is performed by a lithographic process.

3. The method of claim 2, wherein widths of the critical dimensions of the second plurality of recesses are below a resolution limit of the lithographic process.

4. The method of claim 1, wherein the mask material comprises an organic material, dielectric material, or silicon.

5. The method of claim 1, wherein the to-be-patterned layer is a layer stack, wherein the layer stack comprises a middle layer, a planarization layer, and a bottom layer, the planarization layer disposed between the middle layer and the bottom layer.

6. The method of claim 5, further comprising, after patterning the layer stack, removing remaining portions of the mask material, the first material, the middle layer, and the planarization layer, the removing forming a third plurality of lines in the bottom layer.

7. The method of claim 5, further comprising, before performing the cyclic process, etching the middle layer using the first plurality of lines as an etch mask to expose the planarization layer, the middle layer becoming a part of the first plurality of lines.

8. The method of claim 5, further comprising, before performing the cyclic process, etching the middle layer and a portion of the planarization layer using the first plurality of lines as an etch mask, the middle layer becoming a part of the first plurality of lines.

9. The method of claim 5, further comprising, before performing the cyclic process, etching the middle layer and the planarization layer using the first plurality of lines as an etch mask to expose the bottom layer, the middle layer and the planarization layer becoming a part of the first plurality of lines.

10. A method of processing a substrate, the method comprising:

patterning, using a lithographic process, a photoresist layer formed over a first layer to form a recess in the patterned photoresist layer, a first portion of the first layer exposed at a bottom surface of the recess and a second portion of the first layer being covered by the patterned photoresist layer;

forming a pattern comprising a mask material over the patterned photoresist layer, the forming comprising:
  depositing a top mask and a bottom mask, the top mask being deposited to be in contact with the patterned photoresist layer, the bottom mask being deposited to be in contact with the first layer within the first portion, the top and the bottom masks comprising the mask material; and
  forming recesses between the patterned photoresist layer and the bottom mask by a trimming process; and transferring the pattern of the mask material to a second layer disposed below the first layer by etching using the top mask and the bottom mask as an etch mask.

11. The method of claim 10, wherein forming the recesses comprises laterally etching through sidewalls of the patterned photoresist layer during the trimming process.

12. The method of claim 10, wherein forming the recesses comprises etching the mask material along sidewalls of the bottom mask during the trimming process.

13. The method of claim 10, further comprising performing a smoothening process to reduce a surface roughness of a sidewall of the patterned photoresist layer.

14. The method of claim 10, wherein the top mask and the bottom mask have different compositions.

15. The method of claim 10, wherein the depositing is performed by a vapor deposition process using a deposition gas comprising a hydrocarbon, and wherein the trimming process is performed by a dry etch process using an etch gas comprising oxygen, $H_2$, $CO_2$, $N_2$, CO, or $CH_4$.

16. The method of claim 10, further comprising:
  measuring a topology of the substrate; and
  based on the measuring, updating a process recipe for the forming.

17. A method comprising:
  forming, with a lithographic process, a patterned photoresist layer comprising a first plurality of lines at a first pitch and a first plurality of recesses separating the first plurality of lines from each other;
  forming, without an additional lithographic process, an etch mask comprising a first mask disposed on the first plurality of lines and a second mask disposed on the first plurality of recesses, wherein forming the etch mask comprises laterally etching through sidewalls of the patterned photoresist layer or the second mask
    to form a third plurality of recesses between the patterned photoresist layer and the second mask; and
  etching through a to-be-patterned layer using the etch mask to form a second plurality of lines at a second pitch and a second plurality of recesses separating the second plurality of lines from each other, the second pitch being smaller than the first pitch.

18. The method of claim 17, wherein forming the etch mask comprises:
  depositing a mask material to form the first mask and the second mask,
    the forming of the etch mask comprising laterally etching through the sidewalls of the patterned photoresist layer.

19. The method of claim 17, wherein forming the etch mask comprises:
  depositing a mask material to form the first mask and the second mask,
    the forming of the etch mask comprising laterally etching the mask material along the sidewalls of the second mask.

20. The method of claim 17, wherein forming the etch mask comprises:
  performing a cyclic process comprising a plurality of cycles, each of the plurality of cycles comprising:
    depositing a mask material over the first plurality of lines and within the first plurality of recesses, the mask material deposited within the first plurality of recesses defining a third plurality of lines, each of the third plurality of lines dividing one of the first plurality of recesses to form the third plurality of recesses; and
  wherein forming of the etch mask comprises performing a trimming process to increase critical dimensions of the third plurality of recesses.

* * * * *